US011692133B2

(12) United States Patent
Kundaliya et al.

(10) Patent No.: US 11,692,133 B2
(45) Date of Patent: *Jul. 4, 2023

(54) PROCESS OF MANUFACTURING A CONVERSION ELEMENT, CONVERSION ELEMENT AND LIGHT EMITTING DEVICE COMPRISING THE CONVERSION ELEMENT

(71) Applicant: OSRAM Opto Semiconductors GmbH, Regensburg (DE)

(72) Inventors: Darshan Kundaliya, Middleton, MA (US); Jeffery J. Serre, Peabody, MA (US); James Avallon, Beverly, MA (US); Kathleen A. Lawson, Amesbury, MA (US)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 17/643,702

(22) Filed: Dec. 10, 2021

(65) Prior Publication Data

US 2022/0098478 A1 Mar. 31, 2022

Related U.S. Application Data

(62) Division of application No. 16/101,270, filed on Aug. 10, 2018, now Pat. No. 11,254,865.

(51) Int. Cl.
*C09K 11/77* (2006.01)
*C09K 11/08* (2006.01)
(Continued)

(52) U.S. Cl.
CPC .......... *C09K 11/0822* (2013.01); *C01F 17/34* (2020.01); *H01L 21/02538* (2013.01);
(Continued)

(58) Field of Classification Search
CPC ............ C09K 11/7774; C09K 11/7721; C09K 11/0822; C09K 11/7706; C09K 11/77;
(Continued)

(56) References Cited

U.S. PATENT DOCUMENTS

| 8,088,304 B2 | 1/2012 | Winkler et al. |
| 9,401,453 B2 | 7/2016 | Choi |
| 10,240,086 B2 | 3/2019 | Raukas et al. |
| 10,591,137 B2 * | 3/2020 | Kelso ................... H01L 33/502 |

(Continued)

FOREIGN PATENT DOCUMENTS

| CN | 101360689 A | 2/2009 |
| CN | 101641425 A | 2/2010 |

(Continued)

OTHER PUBLICATIONS

Hui-Li Li, et al., "Fabrication of Transparent Cerium-Doped Lutetium Aluminum Garnet (LuAG:Ce) Ceramics by a Solid-State Reaction Method", Communications of the American Ceramic Society, vol. 88, No. 11, 2005, pp. 3226-3228.

*Primary Examiner* — Matthew E. Hoban
*Assistant Examiner* — Lynne Edmondson
(74) *Attorney, Agent, or Firm* — Slater Matsil, LLP

(57) ABSTRACT

In an embodiment a conversion element includes a first phase and a second phase, wherein the first phase comprises lutetium, aluminum, oxygen and a rare-earth element, wherein the second phase comprises $Al_2O_3$ single crystals, and wherein the conversion element comprises at least one groove.

20 Claims, 8 Drawing Sheets

(51) Int. Cl.
*C01F 17/34* (2020.01)
*H01L 33/50* (2010.01)
*H01L 21/02* (2006.01)
*H01L 33/26* (2010.01)

(52) U.S. Cl.
CPC .......... *H01L 33/26* (2013.01); *C01P 2002/20* (2013.01); *C01P 2002/54* (2013.01); *C01P 2004/03* (2013.01); *C01P 2004/61* (2013.01)

(58) Field of Classification Search
CPC ..... C09K 11/61; H01L 33/502; H01L 33/504; H01L 33/505; H01L 33/50; H01L 33/22; H01L 33/26; H01L 21/02538; C01P 2002/20; C01P 2004/80; C01F 17/34
See application file for complete search history.

(56) References Cited

U.S. PATENT DOCUMENTS

| | | | |
|---|---|---|---|
| 11,254,865 | B2 * | 2/2022 | Kundaliya ............ C04B 35/44 |
| 2009/0162623 | A1 | 6/2009 | Foresti et al. |
| 2010/0142181 | A1 | 6/2010 | Schmidt et al. |
| 2010/0209673 | A1 | 8/2010 | Viasnoff et al. |
| 2012/0018673 | A1 | 1/2012 | Raukas et al. |
| 2015/0085497 | A1 * | 3/2015 | Kelso ....................... F21K 9/64 |
| | | | 313/503 |
| 2015/0144978 | A1 | 3/2015 | Miyagawa et al. |
| 2020/0048547 | A1 | 2/2020 | Kundaliya et al. |

FOREIGN PATENT DOCUMENTS

| | | |
|---|---|---|
| CN | 101801874 A | 8/2010 |
| CN | 102690113 A | 9/2012 |
| CN | 103969735 A | 8/2014 |
| CN | 104396028 A | 3/2015 |
| JP | 2000185407 A | 7/2000 |

* cited by examiner

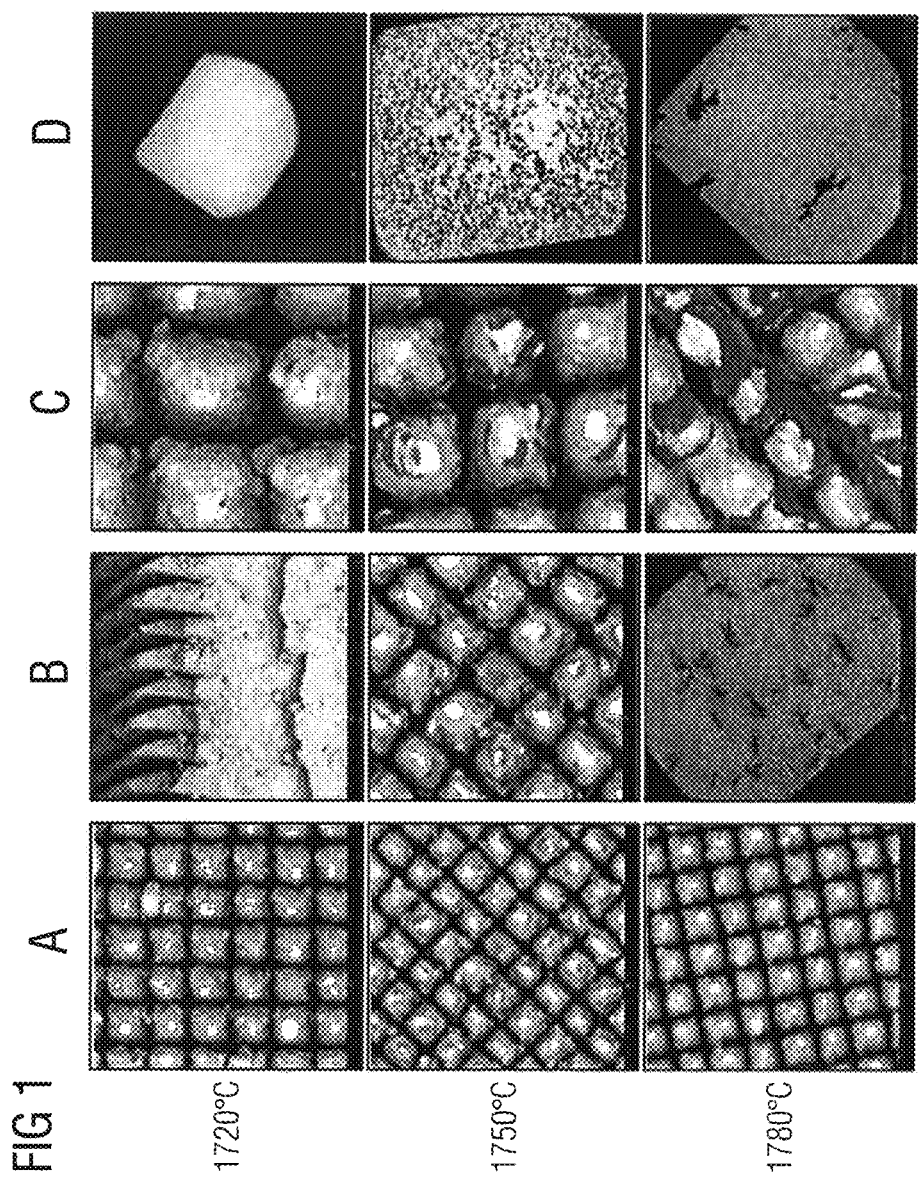

FIG 5

| Element Number | Element Symbol | Element Name | Atomic Conc. | Weight Conc. |
|---|---|---|---|---|
| 8 | O | Oxygen | 72.89 | 36.74 |
| 13 | Al | Aluminium | 16.98 | 14.44 |
| 71 | Lu | Lutetium | 8.69 | 47.90 |
| 6 | C | Carbon | 1.10 | 0.42 |

PROCESS OF MANUFACTURING A CONVERSION ELEMENT, CONVERSION ELEMENT AND LIGHT EMITTING DEVICE COMPRISING THE CONVERSION ELEMENT

CROSS REFERENCE TO RELATED APPLICATION

This is a divisional application of U.S. application Ser. No. 16/101,270, entitled "Process of Manufacturing a Conversion Element, Conversion Element and Light Emitting Device Comprising the Conversion Element," which was filed on Aug. 10, 2018, of which is incorporated herein by reference in its entirety.

TECHNICAL FIELD

The invention relates to a process of manufacturing a conversion element. Moreover, the invention relates to a conversion element and a light emitting device comprising the conversion element.

BACKGROUND

Conversion elements are frequently employed in light emitting devices, such as LEDs (light emitting diodes) or LASERs (light amplification by stimulated emission of radiation devices). The optical performance of light emitting devices depends on the heat dissipation within the device. In order to achieve efficient heat dissipation there is a need for conversion elements with high thermal conductivities. Moreover, there is a need for processes of manufacturing such conversion elements that can be carried out with reasonable technical effort in a cost-efficient manner.

SUMMARY

Embodiments of the invention specify a process of manufacturing a conversion element. Further embodiments of the invention specify a conversion element and a light emitting device comprising the conversion element having an improved performance.

One embodiment provides a method of manufacturing a conversion element. A precursor material is selected from one or more of lutetium, aluminum and a rare-earth element. The precursor material is mixed with a binder and a solvent to obtain a slurry. A green body is formed from the slurry and the green body is sintered to obtain the conversion element. The sintering is performed at a temperature of more than 1720° C.

Another embodiment provides a conversion element that comprises a first phase and a second phase. The first phase comprises lutetium, aluminum, oxygen and a rare-earth element and the second phase comprises $Al_2O_3$ single crystals.

BRIEF DESCRIPTION OF THE DRAWINGS

The process, the conversion element and the light emitting device described herein are explained in greater detail below with reference to exemplary embodiments and the associated figures, in which:

FIG. 1 shows scanning electron microscopy images illustrating the surface morphology of conversion elements according to embodiments of the present invention and reference examples;

FIG. 5 is a table summarizing EDX-data of the composition of a conversion element according to an embodiment of the present invention;

Figure 2B:
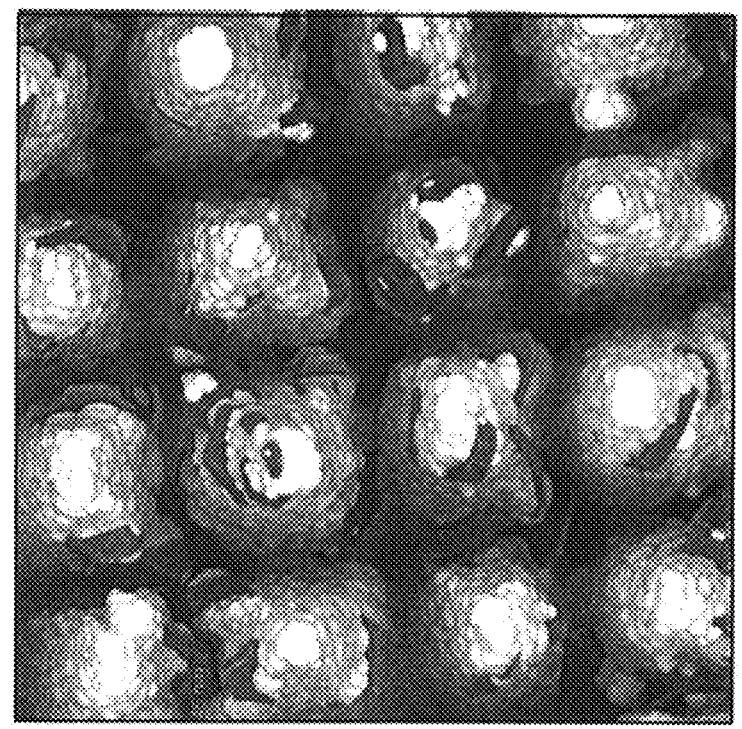
FIGS. 2A to 2D show scanning electron microscopy images at various magnifications of a conversion element according to an embodiment of the present invention.

Identical or similar elements, or elements acting in an identical manner, are provided with the same reference numerals in the figures. In each case, the figures are schematic views and are therefore not necessarily true to scale. Rather, comparatively small elements, and in particular layer thicknesses, may be illustrated excessively large for clarification purposes.

DETAILED DESCRIPTION OF ILLUSTRATIVE EMBODIMENTS

Embodiments of the present invention relate to a process of manufacturing a conversion element, comprising: A) providing one or more precursor materials, comprising lutetium, aluminum and a rare-earth element, B) mixing of the one or more precursor materials with a binder and a solvent such that a slurry is obtained, C) forming a green body from the slurry of step B), and F) sintering the green body to obtain the conversion element, wherein sintering is performed at a temperature of more than 1720° C.

The term conversion element is to be understood as an element, which is capable of transforming electromagnetic radiation with a first wavelength (primary radiation) into electromagnetic radiation with a second wavelength (secondary radiation), wherein the second wavelength is longer than the first wavelength. For instance, the primary radiation can be UV light or blue light and the secondary radiation may be visible light having a longer wavelength, such as green or red light. For instance, the conversion element is a ceramic conversion element, such as a ceramic platelet.

The process of the present invention results in the formation of a conversion element, comprising a first phase and a second phase. The first phase comprises lutetium, aluminum, oxygen and a rare-earth element, while the second phase comprises $Al_2O_3$ single crystals. For instance, $Al_2O_3$ hexagonal single crystals are formed, which may have formed as microplatelets.

For instance, the first phase comprises LuAG (LuAG=$Lu_3Al_5O_{12}$) which is preferably doped with a rare-earth element, such as Cerium. In that case the conversion element comprises a first phase, wherein the first phase comprises $Lu_3Al_5O_{12}$:Ce.

In contrast to common manufacturing processes, wherein the resulting conversion element only comprises a single phase (e.g., a single phase of $Lu_3Al_5O_{12}$:Ce), a second phase comprising $Al_2O_3$ crystals is introduced during the manufacturing process of the present invention.

Namely, the inventors of the present invention have observed that sintering temperatures of more than 1720° C.

result in the formation of $Al_2O_3$ single crystals. These crystals are organically grown and self-embedded within the conversion element during high temperature sintering performed in step F).

In contrast to that, standard manufacturing processes, in particular processes drawn to the formation of conversion elements comprising $Lu_3Al_5O_{12}$:Ce, are carried out at lower sintering temperatures and thus no second phase comprising $Al_2O_3$ single crystals is formed.

The inventors of the present invention have observed that $Al_2O_3$ single crystals, due to their high thermal conductivity, facilitate heat dissipation in the obtained conversion element. This results in an improved optical performance when used in a light emitting device. The conversion element is furthermore able to handle higher incident high energetic photon flux (e.g., UV or blue photon flux). This is particularly beneficial when employed in high power LED applications or in case of LASER applications.

The introduction of $Al_2O_3$ single crystals is solely achieved due to the use of a temperature of more than 1720° C. during high temperature sintering in process step F). That is, no additional polycrystalline or single crystalline $Al_2O_3$ powder has to be added in order to obtain a second phase of $Al_2O_3$ crystals, but the embedding of $Al_2O_3$ single crystals occurs solely due to temperature control.

While it is possible to add further single or polycrystalline $Al_2O_3$ in the course of the inventive process to further increase the $Al_2O_3$ crystal content in the conversion element, an addition of extra $Al_2O_3$ is not required in order to form a second phase in the conversion element comprising $Al_2O_3$ single crystals.

Another way to form conversion elements comprising $Al_2O_3$ crystals is to intentionally introduce polycrystalline or single crystal $Al_2O_3$ during the manufacturing process, which is performed at temperatures of 1720° C. or below. In that case a matrix phase can be formed from the introduced $Al_2O_3$. Thus a conversion element comprising a $Lu_3Al_5O_{12}$:Ce phase and a matrix phase of $Al_2O_3$ can be obtained. However, the matrix phase of $Al_2O_3$ formed during a respective process is highly polycrystalline. Polycrystalline $Al_2O_3$ comprises grain boundaries, which reduce thermal conductivity and thus hamper heat dissipation. Moreover, in such a process the size of the particles of the $Al_2O_3$ powder added can be a limiting factor to the ultimate size of any alumina microcrystals that are formed. In order to improve the outcome of respective processes extensive engineering and treatment of the $Al_2O_3$ powder used as a starting material is required.

In contrast to respective processes, the inventive process, wherein single crystalline $Al_2O_3$ is organically grown during sintering at temperatures of more than 1720° C., does not require further process steps of adding $Al_2O_3$. Moreover, the process of the present invention does not require extensive engineering and treatment, which is required for pretreatment of $Al_2O_3$ in the above mentioned processes. Therefore, the inventive process is cost-efficient and does in particular not require additional engineering steps.

Moreover, the resulting conversion element comprises organically grown and self-embedded single crystalline $Al_2O_3$, with the single crystalline $Al_2O_3$ having better thermal conductivities compared to polycrystalline $Al_2O_3$.

Further embodiments of the inventive process are discussed in the following.

According to at least one embodiment of manufacturing a conversion element step F) is performed at a sintering temperature of more than 1720° C., preferably more than 1730° C., for instance more than 1740° C. As discussed above, if the sintering is performed at temperatures of 1720° C. or below no detectable amount of $Al_2O_3$ single crystals are formed. Formation of $Al_2O_3$ single crystals can be observed at temperatures above 1720° C. The higher the temperature the larger the size of the single crystals and the better the thermal conductivity of the resulting conversion element.

According to at least one embodiment of manufacturing a conversion element step F) is performed at a sintering temperature of less than 1800° C., preferably less than 1790° C., more preferably less than 1780° C., for instance less than 1770° C. or even less than 1760° C. If the sintering temperature is very high the single crystals become very large. At some point multiple single crystals grow together. This can result in an uncontrolled cluster formation in the conversion element and a poor distribution of the formed $Al_2O_3$ crystals. In this case polycrystalline $Al_2O_3$ can be formed and the effectivity of heat dissipation may decrease.

According to at least one embodiment of the inventive process of manufacturing a conversion element step F) is performed at a sintering temperature of more than 1720° C. and less than 1780° C., for instance more than 1730° C. and less than 1770° C., such as 1740° C. to 1760° C., for example, 1750° C.

The skilled artisan understands that the temperature ranges in some cases may be influenced by the furnace settings. The temperatures thus may be slightly different for other furnace settings, while the outcome remains the same.

If the sintering is performed within this range, $Al_2O_3$ single crystals are formed, which have a sufficient size in order to improve thermal conductivity and at the same time are well-defined and well-embedded in the conversion element. An undesired, uncontrolled multiple cluster formation thus can be mitigated or avoided.

According to at least one embodiment step F) is performed in a reducing atmosphere. For instance, the sintering is performed in presence of $H_2$. The sintering may be performed in a wet $H_2$ atmosphere, in a forming gas atmosphere (i.e., atmosphere comprising $N_2$ and $H_2$), or in an atmosphere comprising Ar and $H_2$. During step F) a reduction of precursor materials comprising the rare-earth element can take place. For instance, $Ce^{4+}$ is reduced to $Ce^{3+}$ and thus activated.

According to at least one embodiment step F) is performed in the presence of a flux or a sintering aid. For instance, the flux is barium aluminate. The skilled artisan knows that sintering aids can influence the sintering temperature. Different sintering aids may result in different sintering temperatures while still resulting in the same outcome.

According to at least one embodiment step A) comprises providing a first precursor material comprising lutetium, providing a second precursor material comprising aluminum and providing a third precursor material comprising a rare-earth element, such as cerium. The first, second and third precursor materials preferably are selected from oxides and/or nitrates.

Alternatively step A) comprises providing only one precursor material, wherein the one precursor material comprises lutetium, aluminum and a rare-earth element, such as cerium. For instance, the only one precursor material can be $Lu_3Al_5O_{12}$:Ce.

According to at least one embodiment step A) comprises providing a first precursor material comprising lutetium, a second precursor material comprising aluminum and a third precursor material comprising a rare-earth element, wherein the first precursor material is $Lu_2O_3$, the second precursor material is $Al_2O_3$ and the third precursor material is $CeO_2$.

These materials are suitable and readily available starting materials in order to form a conversion element comprising a first phase, which comprises $Lu_3Al_5O_{12}$:Ce and a second phase, which comprises $Al_2O_3$ single crystals.

According to at least one embodiment of the process, the one or more precursor materials of step A) are powders.

According to at least one embodiment the one or more precursor materials of step A) are provided in the stoichiometric ratio of $Lu_3Al_5O_{12}$:Ce.

The content of cerium may be 0 to 4 at. %, in particular 0.01 to 4 at. %, preferably 0.1 to 2 at. %. For instance, the content of cerium is 0.3 to 0.7 at. %, such as 0.5 at. % or the content of cerium is 1.5 to 1.9 at. %, such as 1.75 at. %. The content of cerium can be adapted to the thickness of the conversion element, as required.

According to at least one embodiment the one or more precursor materials of step A) are provided in the stoichiometric ratio of $Lu_3Al_5O_{12}$:Ce and in addition sintering aids are added.

According to at least one embodiment of the inventive process the mixing in step B) is performed via ball milling. The ball milling results in mixing and homogenizing of the one or more precursor materials along with the binder and solvent. Ball milling can be performed at a controlled rolling speed.

According to at least one embodiment the ball milling is performed for a time period ranging from 2 hours to 4 days.

The longer the time period the finer the resulting slurry that is the resulting slurry only comprises materials of a very fine particle size.

According to at least one embodiment of the inventive process the solvent of step B) is an aqueous solvent, such as water or a non-aqueous solvent, such as hexane, acetone or methanol. Aqueous solvents, such as water, are particularly suitable, as they are environmentally beneficial, do not have a negative impact on LuAG and can be used in combination with various types of binders.

According to at least one embodiment of the inventive process the binder of process step B) is a binder based on or comprising polyvinylidenefluoride (PVDF) or polyvinylalcohol (PVA). These binders are suitable to facilitate formation of green bodies.

According to at least one embodiment of the process of manufacturing a conversion element, the green body of step C) is a green tape and the green tape is formed in step C) from the slurry of step B) via tape casting.

According to at least one embodiment the green body is formed from a green tape, wherein the green tape is formed in step C) from the slurry of step B) via tape casting. It is furthermore possible that the green body comprises a green tape or portions of a green tape, which are formed in step C) from the slurry of step B) via tape casting. For instance, the green body can be a laminate formed of green tapes or a laminate formed of portions of a green tape. In that case the green body can be referred to as a green tape laminate, such as a green tape laminate comprising at least one green tape or portions of at least one green tape formed in step C) from the slurry of step B) via tape casting.

Tape casting is to be understood as a casting process used in the manufacture of thin ceramic tapes from a slurry. The slurry is cast in a thin layer onto a flat surface. In this way the green tape is formed.

According to at least one embodiment of the process of manufacturing a conversion element the slurry is cast onto the surface of a polymer film.

According to at least one embodiment of the process the polymer film comprises or consists of polyethylene-terephthalate (PET). Polymer films, such as polymer films based on PET, are highly flexible. They can be easily removed from the resulting green tape, that is, a delamination can be performed easily.

In accordance with at least one embodiment the resulting green tape is a green tape adapted to react to $Lu_3Al_5O_{12}$:Ce upon sintering.

According to at least one embodiment of the process of manufacturing a conversion element the thickness of the formed green tape is between 20 µm and 60 µm, for instance between 30 µm and 50 µm, such as 40 µm.

According to at least one embodiment of the process a step C1) takes place after step C). Step C1) comprises drying of the green body. For instance the green body is a green tape, which is dried.

According to at least one embodiment a step C2) takes place after step C), for instance after step C1). Step C2) is a delamination step, wherein the green tape is separated from the polymer film.

According to at least one embodiment a step C3) takes place after step C), for instance after step C2). Step C3) comprises dividing the green body into portions. Dividing the green body into portions may be performed via cutting or punching. For instance, the green body is a green tape, which is divided into portions of a defined size via cutting or punching.

According to at least one embodiment the portions of the green tape have a surface area of about 2 to 4 square inches (that is about 12.9 to 25.8 square centimeters).

According to at least one embodiment the portions have a thickness between 20 µm and 60 µm, for instance between 30 µm and 50 µm, such as 40 µm.

According to at least one embodiment a step C4) takes place after step C3). Step C4) comprises laminating several portions of green tapes—which are for instance obtained in step C3)—on top of each other. In this way a green tape laminate is formed.

In step C4) 2 to 12 portions of green tape, preferably 4 to 8 portions of green tape, for example, 6 portions of green tape are arranged on top of each other.

In this context pressure may be employed in order to form the green tape laminate.

In the case of the present invention the term green body thus can be understood as a green tape formed during tape casting.

Moreover, the term green body also can be understood as a green tape laminate, which comprises or consists of several green tapes or portions of a green tape arranged on top of each other.

According to at least one embodiment the thus obtained green body (which is preferably a green tape laminate) has a thickness between 50 and 500 µm (after lamination), preferably between 230 to 260 µm, for instance about 240 µm (=6×40 µm).

According to at least one embodiment a step C5) is performed after step C4). Step C5) comprises bringing the green body into the shape of a platelet, for instance via cutting or punching. According to at least one embodiment the platelets have a surface area of about 2 square millimeters.

According to at least one embodiment the process of the present invention comprises a step D), of structuring a surface of the green body, which is performed prior to step F).

For instance, the green body is a green tape laminate and a surface of the green tape laminate is structured or the green body is a green tape and a surface of the green tape is structured.

Structuring the surface prior to sintering results in the formation of $Al_2O_3$ crystals, which are distributed relatively evenly at the surface of the conversion element. That is, surface structuring significantly improves the distribution of $Al_2O_3$ single crystals at the surface of the conversion element. This may at least in part be attributed to an increase in surface area due to surface structuring.

The $Al_2O_3$ single crystals, which are formed at the structured surface of the conversion element, at least partly protrude from the surface structure. The inventors have understood that $Al_2O_3$ single crystals function as additional non-absorbing transparent scatterers having a different index of refraction. Therefore, a conversion element with improved light scattering properties is obtained enabling efficient photon recycling and light extraction as a consequence of surface structuring. Surface structuring in combination with $Al_2O_3$ single crystals enables higher absorption of blue photons in the body of the conversion element resulting into higher lumen output of light emitting devices comprising respective conversion elements.

According to at least one embodiment of the inventive process structuring a surface of the green body is performed via LASER structuring, such as LASER etching. In this way a well-defined surface structure can be obtained with little technical effort.

According to at least one embodiment surface structuring comprises formation of a surface structure of a defined depth, wherein the depth may be 5 to 50 µm, for instance 10 to 40 µm, such as 10 to 30 µm or 10 to 20 µm. For instance, the surface structure comprises recesses having a depth of 10 to 40 µm or of 10 to 30 µm or of 10 to 20 µm. The recesses can be linear recesses such as grooves.

According to at least one embodiment, surface structuring comprises the formation of a surface pattern, for instance a regular surface pattern.

According to at least one embodiment of the process, surface structuring comprises the formation of grooves with a defined depth. A groove is to be understood as a recess having a linear shape.

Grooves are particularly suitable to obtain a well-defined surface structure and facilitate the distribution of $Al_2O_3$ single crystals at the surface of the resulting conversion element. For instance, surface structuring may comprise the formation of a multitude of grooves. For instance a multitude of parallel, equidistant grooves can be formed.

According to one embodiment surface structuring may comprise the formation of a checked surface pattern. The checked surface pattern being formed by a multitude of parallel grooves. For instance, the checked surface pattern is formed by a multitude of parallel grooves, wherein a first group of parallel grooves intersects a second group of parallel grooves, for instance at an angle of 90°.

A checked surface pattern is suitable in order to obtain an excellent distribution of $Al_2O_3$ single crystals at the surface of the conversion element.

According to a further development of the inventive process the average depth of the grooves is between 5 µm and 50 µm, preferably between 10 µm and 40 µm.

If the depths are too small, the effect of the distribution of $Al_2O_3$ single crystals becomes less evenly. In this case the effect of improved scattering is less pronounced. If the depth is too large, the stability of the resulting conversion element will decrease. Namely, the resulting conversion element can be damaged more easily.

The inventors of the present invention have observed that a depth of 10 to 40 µm is preferred in combination with a sintering temperature in step F) of more than 1720° C. and less than 1780° C. Moreover, a depth of 10 to 30 µm is particularly preferred for the given temperature range in order to achieve $Al_2O_3$ single crystals with an excellent distribution and to achieve conversion elements with high efficiency. Moreover, a depth of 10 to 20 µm is further preferred in order to achieve both excellent distribution, efficiency and stability. If the depth is too high the stability of the conversion element may decrease.

According to a further embodiment surface structuring comprises the formation of a recess and/or grooves having a depth of 5 to 20 µm, for instance 5 to 15 µm, such as 10 µm in combination with a sintering temperature in step F) of 1770° C. to 1790° C., such as 1775° C. to 1785° C., for instance 1780° C. This specific combination results in an expectantly high optical performance (See FIG. 6). Namely, a very high conversion quantum efficiency is achieved.

According to at least one embodiment the surface structure has grooves and the grooves have an average pitch size of between 25 µm and 50 µm, for instance of 25 µm to 40 µm, such as 30 µm. The term pitch in this case refers to the distance of two grooves that is the distance between the lowest points of two adjacent grooves with respect to the surface of the conversion element.

According to at least one embodiment surface structuring may comprise the formation of a surface structure, wherein the surface structure is characterized by a height, i.e., a depth, and a pitch size. For instance the term depth is to be understood as the depth of a recess or groove. The term pitch size for instance refers to the distance between two recesses or grooves.

According to at least one embodiment the surface structuring comprises forming a surface structure, which has a ratio of depth to pitch size in a range from 2 to 0.1, preferably in the range from 0.7 to 0.3, such as 0.5. This is for instance the case if the depth is 15 µm and the pitch size is 30 µm.

According to at least one embodiment of the process of manufacturing a conversion element the process further comprises a step E) of calcinating the green body. For instance, calcination of the green tape and/or green tape laminate is performed. Step E) is performed after step C) and before step F).

In accordance with a further development of the process the calcination of step E) is performed at a temperature between 700° C. and 1200° C., such as 1000° C. to 1200° C. The calcination may be performed for at least 10 min and at most 12 h, for example, for at least 15 min and at most 2 h. For instance, calcination can be performed at 1150° C. for 30 min.

In accordance with a further embodiment step E) is performed in an oxygen comprising atmosphere, preferably in air.

During step E) remainders of the binder and solvent are removed from the green body.

According to at least one embodiment of the process of manufacturing a conversion element the process further comprises a step G) of annealing the sintered body. For instance, annealing of the sintered punch platelets is performed. Step G) is performed after step F).

Step G) allows to reduce defects, which may have been formed during the sintering step F). Step G) in particular allows increasing the content of $Ce^{3+}$ in the conversion element. In this way the properties of the conversion element can be further improved. Namely, an improved brightness and/or a more uniform brightness can be achieved.

In accordance with a further development of the process the annealing of step G) is performed at a temperature between 700° C. and 1200° C., such as 1000° C. to 1200° C. The annealing may be performed for at least 10 min and at most 12 h, for example, for at least 15 min and at most 2 h. For instance, annealing can be performed at 1050° C. for 60 min.

In accordance with a further embodiment step G) is performed in a controlled gas atmosphere, preferably forming gas having Nitrogen or Argon with oxygen.

In accordance with at least one embodiment of the process of manufacturing a conversion element, during or after step A) no further material comprising aluminum is added except of the one or more precursor materials. In particular, no additional single or polycrystalline $Al_2O_3$ is added. Specifically no $Al_2O_3$ is added, which goes beyond the stoichiometric amount required for the formation of LuAG.

As explained above, the formation of single crystalline $Al_2O_3$ during the process of the present invention does not require the addition of $Al_2O_3$, which exceeds the stoichiometric amount required for the formation of LuAG.

According to another embodiment polycrystalline or single crystalline $Al_2O_3$ is added during process step A) and/or process step B), which exceeds the stoichiometric amount of $Al_2O_3$ required for LuAG formation. In this way a conversion element can be achieved, which comprises both polycrystalline and single crystalline $Al_2O_3$, wherein at least a part of the single crystalline $Al_2O_3$ is formed due to sintering at a temperature above 1720° C. By addition of further $Al_2O_3$ the thermal conductivity and heat dissipation can be further improved and adjusted. Moreover, the additional $Al_2O_3$ may be embedded into the conversion element and may form hexagonal microplatelets.

According to at least one embodiment microcrystalline powder of sapphire is added during process step A) and/or process step B). The sapphire may be embedded into the conversion element and may form hexagonal microplatelets.

The present invention further relates to a conversion element comprising a first phase and a second phase, wherein the first phase comprises lutetium, aluminum, oxygen and a rare-earth element and the second phase comprises $Al_2O_3$ single crystals.

The conversion element of the present invention can be produced by the process of manufacturing a conversion element as described herein. Therefore, features described in connection with the process of manufacturing a conversion element can also be used for the conversion element, and vice versa.

According to at least one embodiment the second phase is embedded into the conversion element. It is in particular distributed throughout the conversion element. It is for instance embedded into the first phase, which is the main phase of the conversion element.

The inventors of the present invention have observed that conversion elements with a second phase comprising or consisting of $Al_2O_3$ single crystals results in an improved thermal conductivity of the conversion element. Based on this, improved heat dissipation within the conversion element and a light emitting device comprising the conversion element can be achieved, which results in an improved optical performance.

According to at least one embodiment the conversion element is a ceramic conversion element.

According to at least one embodiment the conversion element is a platelet.

According to at least one embodiment the conversion element is a ceramic luminescent conversion element.

According to at least one embodiment the first phase comprises $Lu_3Al_5O_{12}$:Ce as a luminescent material. It is further possible that the first phase comprises $Lu_3Al_5O_{12}$:Ce, however with a reduced content with respect to some elements such as Al.

According to at least one embodiment of the conversion element the $Al_2O_3$ single crystals are organically grown, self-embedded single crystals.

According to at least one embodiment the $Al_2O_3$ single crystals are distributed evenly throughout the conversion element. For instance they are distributed evenly in the first phase.

According to at least one embodiment at least some of the $Al_2O_3$ single crystals protrude from a surface of the conversion element. Respective crystals can be used for light scattering and improved light extraction.

According to at least one embodiment of the conversion element the $Al_2O_3$ crystals are hexagonal single crystals. For instance, the $Al_2O_3$ crystals have the shape of hexagonal microplatelets.

According to at least one embodiment of the conversion element, the $Al_2O_3$ single crystals have an average crystal size between 0.5 µm and 15 µm, such as 1 µm and 10 µm, preferably between 2 µm and 8 µm, more preferably between 3 µm and 5 µm.

For crystals, which are hexagonal microplatelets having a hexagonal surface area, the term crystal size here and in the following may be understood as the diameter of a circle, having the same surface area as the hexagonal surface area of the hexagonal microplatelets.

The inventors of the present invention have observed that conversion elements comprising $Al_2O_3$ single crystals in a range between 0.5 and 15 µm, for instance 1 and 10 µm and in particular between 3 and 5 µm do show an excellent thermal conductivity and an excellent distribution of crystals within the conversion element. If the crystal size is becoming very small the effect of improved heat dissipation decreases. If the crystal size is becoming too large, clusters of crystals are formed. In that case, grain boundaries can be formed, which hamper thermal conductivity. Moreover, the overall distribution of the crystals may suffer and an uncontrolled cluster formation takes over.

According to at least one embodiment the conversion element has at least one surface having a surface structure and the $Al_2O_3$ single crystals at least partly protrude from the surface structure.

The inventors of the present invention have observed that $Al_2O_3$ single crystals can be used as non-absorbing transparent scatterers with a different index of refraction. In this way the performance of a light emitting device utilizing the inventive conversion element can be improved.

The surface structuring results in an increased surface area and more single crystals protrude from such an increased surface area and thus result in improved light scattering and extraction.

According to at least one embodiment of the conversion element, the surface structure comprises grooves, having a defined size.

For instance, the surface structuring comprises a multitude grooves, such as a multitude of parallel, equidistant grooves.

According to at least one embodiment the surface structure comprises a checked surface pattern. The checked surface pattern being formed by a multitude of grooves.

According to a further development of the inventive process the average depth of the grooves is between 5 μm and 50 μm, preferably between 10 μm and 40 μm, for instance between m to 20 μm or between 30 μm and 50 μm.

According to at least one embodiment the grooves have an average pitch size of between 25 and 50 μm, for instance of 25 to 40 μm, such as 30 μm.

According to at least one embodiment the surface structure has a depth and a pitch size, wherein the ratio of depth to pitch size is in a range from 2 to 0.1, preferably in a range from 0.7 to 0.3, such as 0.5.

According to at least one embodiment the conversion element comprises additional polycrystalline $Al_2O_3$. In this way the thermal conductivity can be further adjusted.

According to at least one embodiment the conversion element is manufactured with the process of the present invention.

The present invention further relates to a light emitting device comprising a conversion element according to the present invention, wherein the light emitting device further comprises a primary light source, such as a semiconductor chip, adapted to emit primary light during operation of the light emitting device, wherein the conversion element is arranged in a beam path of the primary light source and the conversion element at least partly converts primary radiation into secondary radiation.

The light emitting device comprises the inventive conversion element. Therefore, features described in connection with the inventive conversion element or the process of manufacturing a conversion element can also be used for the light emitting device and vice versa.

The inventors of the present invention have observed that respective light emitting devices have an improved optical performance due to the improved thermal conductivity and heat dissipation introduced by the inventive conversion element.

According to at least one embodiment of the inventive light emitting device the device is selected from the group consisting of light emitting diodes (LEDs) and light amplification by stimulated emission of radiation devices (LASERs).

According to at least one further embodiment the LED is a high power LED.

Light emitting devices such as LEDs, high power LEDs and LASERS, often suffer from ineffective heat dissipation. Standard conversion elements often suffer from low thermal conductivities and thus result in increased temperatures within the light emitting devices, which can result in a decrease in overall optical performance of the device.

In contrast to that, the present invention results in an improved optical performance due to effective heat dissipation.

FIG. 1 shows scanning electron microscopy (SEM) images of conversion elements after sintering. The conversion elements have the shape of platelets. The images of the first row of FIG. 1 show reference conversion elements, which were sintered at a temperature of 1720° C. The images of the second row of FIG. 1 show conversion elements according to a preferred embodiment of the present invention, which were sintered at a temperature of 1750° C. Moreover, the images of the third row of FIG. 1 show conversion elements according to another embodiment of the present invention, which were sintered at 1780° C. The images of the first three columns, that is column A, B and C, show conversion elements having a surface with a surface structure. The surface structure comprises grooves of a defined depth. In contrast to that column D shows conversion elements, wherein the surface is not structured. Surface structuring was performed via LASER etching. The conversion elements were manufactured as described in the following:

All conversion elements were manufactured from the same precursor materials, i.e., $Lu_2O_3$, $Al_2O_3$ and $CeO_2$, which were provided in a stoichiometric amount in order to give $Lu_3Al_5O_{12}$:Ce (with a Ce-content of 0.5 at. %). Powders of the precursor materials were mixed with a PVA-based binder and water in an appropriate portion and were further mixed and homogenized for a few days via ball milling in order to achieve a slurry. The resultant slurry was tape casted on a PET-film. A green tape of a thickness of about 40 μm was obtained and dried. In the next step the green tape was delaminated from the PET-film and cut into portions of a predetermined size (e.g., with a size of about 2 to 4 square inch and a thickness of 40 μm).

Thereafter, the portions undergo multilayer lamination, that is, they are arranged on top of each other. In this way a green tape laminate is formed. In the present case 6 layers were arranged on top of each other to obtain a green tape laminate of a thickness of about 240 μm. The green tape was then punched into platelets having a size of 2 square millimeters and was calcined at 1150° C. for 30 min to remove binders. The calcined platelets were then subjected to sintering at 1720° C., 1750° C. and 1780° C. for 2 hours in a wet $H_2$-atmosphere. After sintering an annealing step is performed in a forming gas atmosphere at 1050° C. for 60 min.

During calcination, sintering and annealing the thickness of the platelets decreases from about 240 μm to about 150 μm. In the case of the conversion elements shown in the images of columns A, B and C surface structuring via LASER etching was employed prior to sintering. Conversion elements were prepared having surface structures comprising grooves with an average depth of 10 am, 20 am, 30 μm and 40 μm. The characteristic surface structure can be seen for the various conversion elements in the images of column A, which shows the conversion elements at a comparatively low magnification (A side view of the surface structure is shown in the first image of column B).

Images at a higher magnification are shown in column C. The images of the reference example, wherein sintering was performed at 1720° C. clearly shows, that no visible formation of a second phase of $Al_2O_3$ single crystals can be observed. In contrast to that a significant amount of $Al_2O_3$ single crystals is formed at 1750° C. Even larger $Al_2O_3$ single crystals are formed at 1780° C. At temperatures as high as 1780° C. the single crystals tend to form clusters. This is also confirmed by the last figure of column B. In this image several clusters can be observed. In contrast to that, no cluster formation is observed at a temperature of 1750° C., but the obtained $Al_2O_3$ single crystals are well distributed in the conversion element and at the surface of the conversion element (Image in the middle of row B).

The comparison of the conversion elements having a structured surface (columns A, B, C) with conversion elements having no structured surface (column D) further illustrates that the distribution of $Al_2O_3$ single crystals is significantly improved in the case of surface structuring prior to sintering. Column D further shows that at temperatures of about 1750° C. the best distribution of crystals is obtained, even in case of no surface structuring.

Figure 2A:
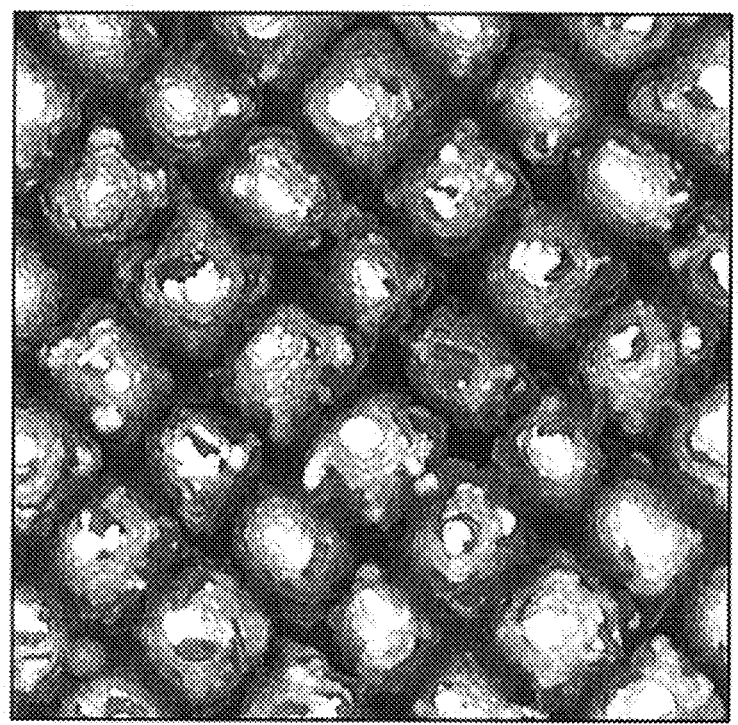
Figures 2C, 2D:
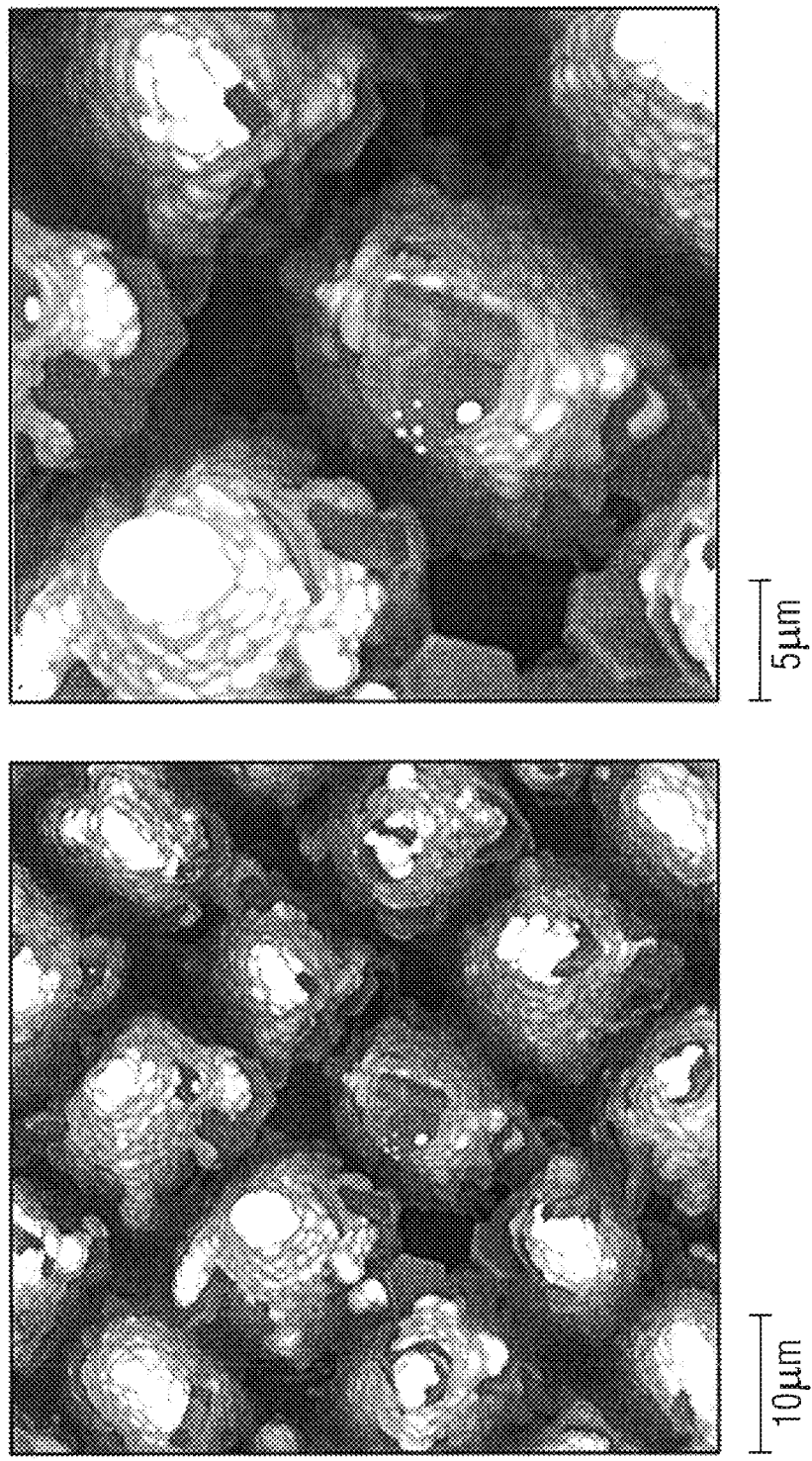

FIGS. 2A to 2D show scanning electron microscopy images of a conversion element, which has a surface structure having parallel equidistant grooves. The grooves intersect each other such that a checkered surface structure is obtained. The conversion element was sintered at a temperature of 1750° C. All SEM images of FIGS. 2A to 2D were recorded in the BSD (backscatter electron detector) mode at an acceleration voltage of 10 kV. FIG. 2A was recorded at a 2500 fold magnification, FIG. 2B at a 3900 fold magnification, FIG. 2C at a 4000 fold magnification and FIG. 2D at a 7800 fold magnification. As can be seen from the SEM images with lower magnification, an excellent distribution of $Al_2O_3$ single crystals is obtained due to surface structuring. The $Al_2O_3$ crystals can be easily identified as dark crystals. The SEM images having a higher magnification clearly show that the $Al_2O_3$ single crystals have the shape of hexagonal microplatelets.

Figure 3:
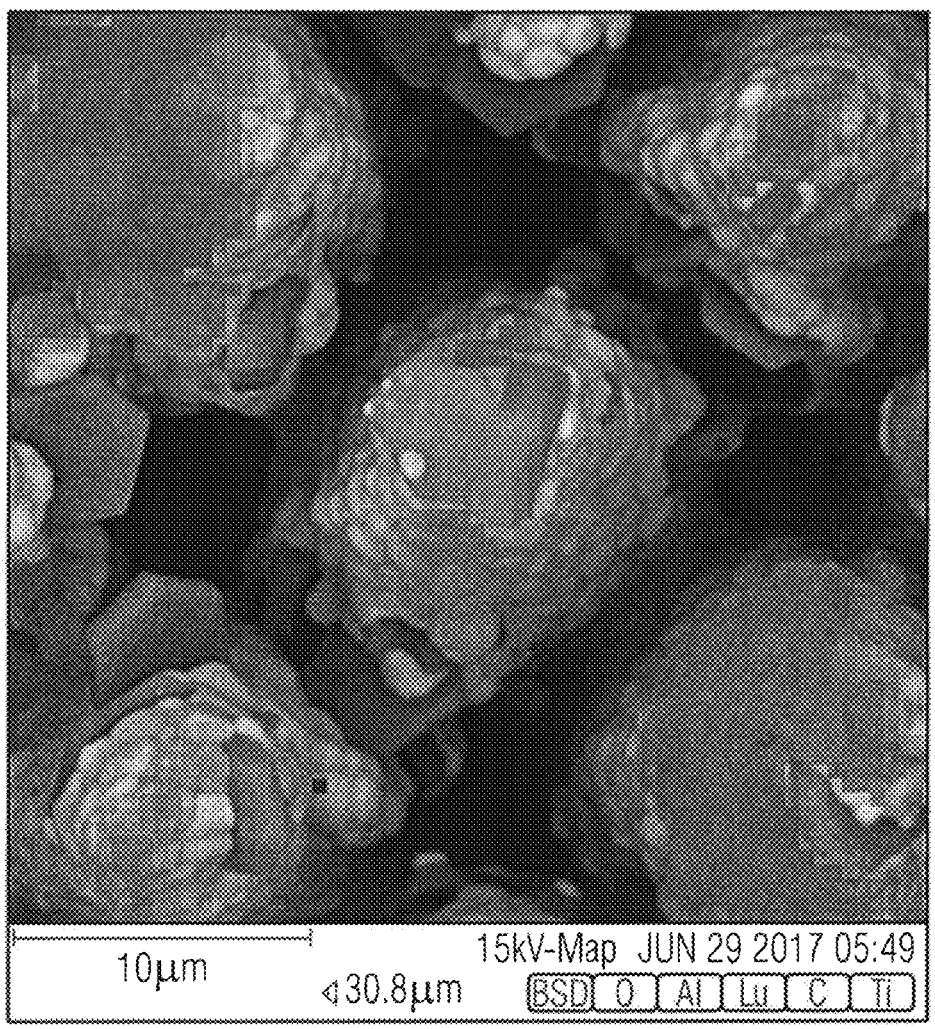
FIG. 3 and FIGS. 4A to 4D are images of elemental mapping for illustrating the result of an energy dispersive X-ray (EDX) analysis to determine the composition of the secondary phase of the conversion element.
Figure 4D:
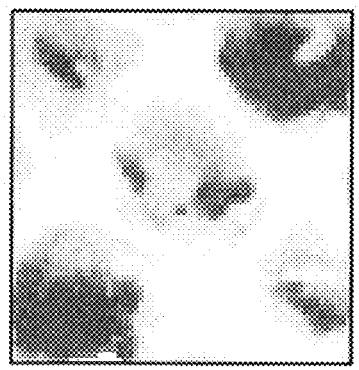
Figure 4C:
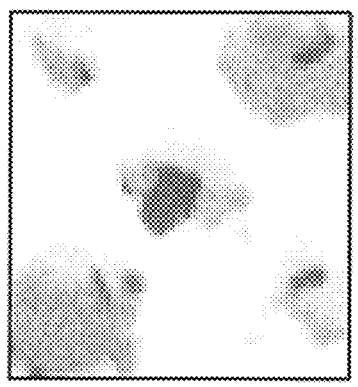
Figure 4B:
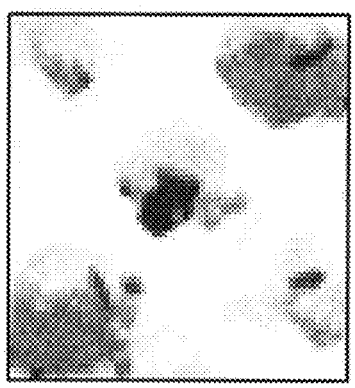
Figure 4A:
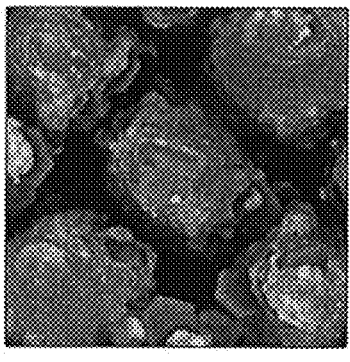

FIGS. 3 and 4A to 4D are images of elemental mapping for illustrating the result of an energy dispersive X-ray (EDX) analysis to determine the composition of the secondary phase of the conversion element. Namely, FIG. 3—which is identical to FIG. 4A—illustrates the same region of a conversion element as FIG. 2D. In FIG. 3 in particular the elements aluminum (Al) and lutetium (Lu) are illustrated. Individual elemental mapping is illustrated for the same region of the conversion element for the elements oxygen (O), aluminum (Al) and lutetium (Lu) in FIGS. 4B to 4D. The EDX-Analysis illustrates that the conversion element manufactured with the inventive process comprises a first phase based on LuAG:Ce and a second phase with $Al_2O_3$ single crystals. Namely, it can be clearly seen that the dark second phase, i.e., single crystals having the shape of hexagonal microplatelets, comprise Al and O, but no Lu, thus confirming the formation of $Al_2O_3$ single crystals. In contrast to that the first phase also comprises Lu.

FIG. 5 summarizes some EDX-data obtained on conversion elements according to an embodiment of the present invention and manufactured with the inventive process.

Figure 6:
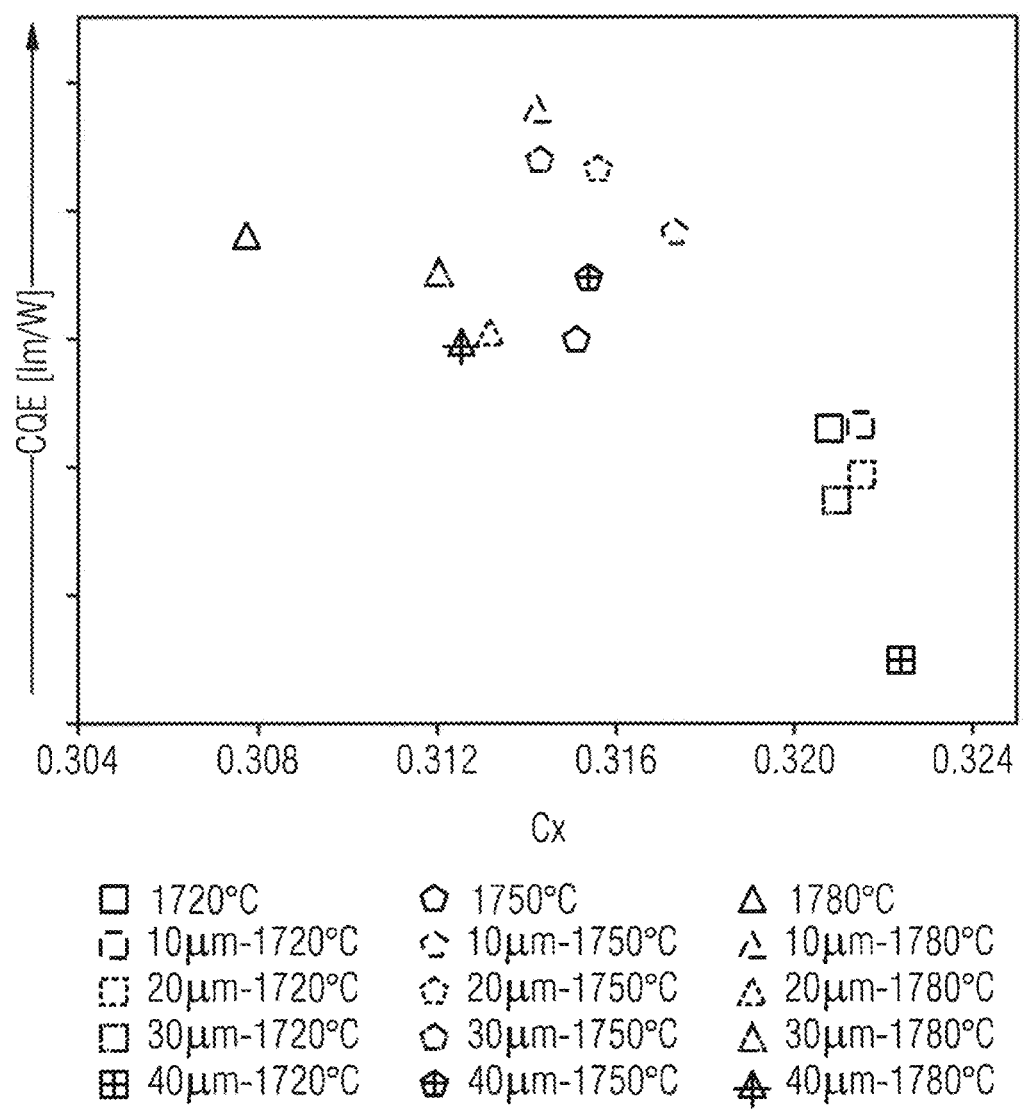
FIG. 6 is a plot of the optical performance, i.e., conversion quantum efficiency (CQE) in lumen per Watt [lm/W], versus color coordinates summarizing experimental data for conversion elements dependent on the sintering temperature and surface structure.

FIG. 6 is a plot of the optical performance that is conversion quantum efficiency measured in lumen per Watt (lm/W) versus color coordinates. Measurements were performed for conversion elements manufactured at sintering temperatures of 1720° C., 1750° C. and 1780° C. Measurements were performed with conversion elements, without surface structuring and at conversion elements having a surface structure comprising grooves with a depth of 10 μm, 20 μm, 30 μm and 40 μm. Every data point depicted in the plot of FIG. 6 is based on a minimum of 5 measurements and at most 20 measurements.

As can be clearly seen from the plot a significant improvement in quantum efficiency in lm/W can be observed for conversion elements, which were sintered at a temperature above 1720° C. The best result with respect to conversion quantum efficiency was obtained at a sintering temperature of 1780° C. in combination with a groove depth of 10 μm. However, in general the best overall performance with respect to efficiency and color coordinates was obtained for sintering temperatures of 1750° C. Conversion elements having a surface structure showed an improved performance compared to conversion elements without surface structure. Groove depths of 10 to 20 μm allow to obtain both good optical performance and high stability of the resulting conversion element.

Figure 7:
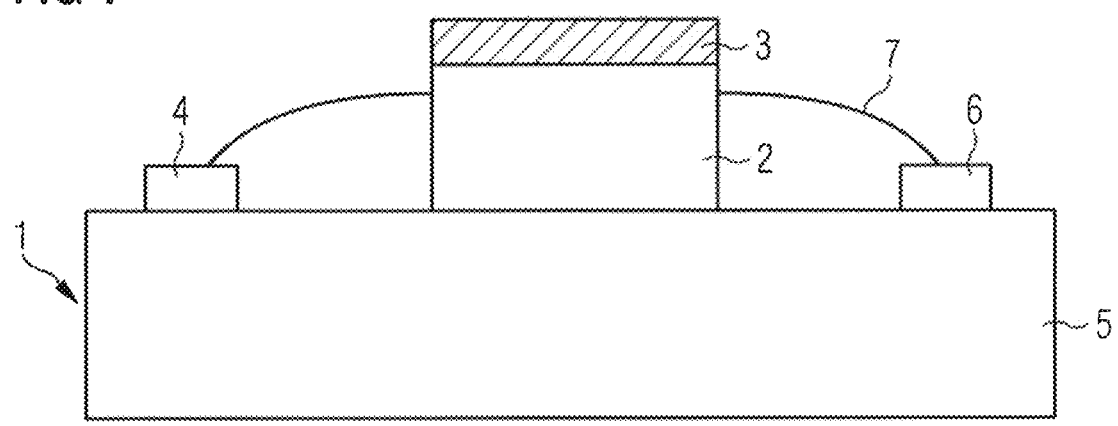
FIG. 7 illustrates a light emitting device comprising a conversion element according to an embodiment of the present invention.

FIG. 7 is a schematic illustration of an exemplary embodiment of a light emitting device according to an embodiment of the present invention. The illustrated light emitting device (1) is a LED with a substrate (5) a semiconductor chip (2) a conversion element according to the present invention (3), electrical contacts (4),(6) and bonding wires (7). The semiconductor chip (2) is adapted to emit UV-light and/or blue light during operation (primary radiation). The conversion element is arranged in a beam path of the semiconductor chip and at least partly converts primary radiation as emitted from the semiconductor chip into secondary radiation having a longer wavelength. The conversion element can have at least one structured surface.

The description made with reference to exemplary embodiments does not restrict the invention to these embodiments. Rather, the invention encompasses any novel feature and any combination of features, including in particular any combination of features in the claims, even if this feature or this combination is not itself explicitly indicated in the claims or exemplary embodiments.

What is claimed is:

1. A conversion element comprising:
    a first phase; and
    a second phase,
    wherein the first phase comprises lutetium, aluminum, oxygen and a rare-earth element, and the second phase comprises $Al_2O_3$ single crystals, and
    wherein the conversion element comprises at least one groove.

2. The conversion element according to claim 1, wherein the first phase comprises $Lu_3Al_5O_{12}$:Ce.

3. The conversion element according to claim 1, wherein the $Al_2O_3$ single crystals are hexagonal single crystals.

4. The conversion element according to claim 1, wherein the $Al_2O_3$ single crystals have an average crystal size between 1 μm and 10 μm.

5. The conversion element according to claim 1, wherein an average depth of the groove is between 5 μm and 50 μm.

6. The conversion element according to claim 1, wherein the conversion element comprises a plurality of grooves.

7. The conversion element according to claim 6, wherein the plurality of grooves comprises a plurality of parallel, equidistant grooves.

8. The conversion element according to claim 6, wherein the plurality of grooves forms a checked surface pattern.

9. The conversion element according to claim 8, wherein the checked surface pattern is formed by a plurality of parallel grooves, and wherein a first group of parallel grooves intersects a second group of parallel grooves.

10. The conversion element according to claim 9, wherein the first group of parallel grooves intersects the second group of parallel grooves at an angle of 90°.

11. The conversion element according to claim 6, wherein the grooves have an average pitch size of between 25 μm and 50 μm.

12. The conversion element according to claim 6, wherein the plurality of grooves has a ratio of depth to pitch size in a range from 2 to 0.1.

13. A light emitting device comprising:
    a primary light source configured to emit primary radiation during operation of the light emitting device; and
    a conversion element arranged in a beam path of the primary light source and configured to at least partly convert the primary radiation into secondary radiation,
    wherein the conversion element comprises a first phase and a second phase,
    wherein the first phase comprises lutetium, aluminum, oxygen and a rare-earth element and the second phase comprises $Al_2O_3$ single crystals, and
    wherein the conversion element comprises at least one groove.

14. The light emitting device according to claim 13, wherein the light emitting device is a light emitting diode or a laser device.

15. The light emitting device according to claim 13, wherein an average depth of the groove is between 5 μm and 50 μm.

16. The light emitting device according to claim 13, wherein the conversion element comprises a plurality of grooves.

17. The light emitting device according to claim 16, wherein the plurality of grooves forms a checked surface pattern.

18. The light emitting device according to claim 16, wherein the grooves have an average pitch size of between 25 μm and 50 μm.

19. A conversion element comprising:
- a first phase; and
- a second phase,
  - wherein the first phase comprises lutetium, aluminum, oxygen and a rare-earth element, and the second phase comprises $Al_2O_3$ single crystals, and
  - wherein the conversion element comprises a checked surface pattern.

20. The conversion element according to claim 19, wherein the checked surface pattern is formed by a plurality of parallel grooves, and wherein a first group of parallel grooves intersects a second group of parallel grooves.

* * * * *